(12) United States Patent
Hynecek et al.

(10) Patent No.: US 8,575,531 B2
(45) Date of Patent: *Nov. 5, 2013

(54) IMAGE SENSOR ARRAY FOR BACK SIDE ILLUMINATION WITH GLOBAL SHUTTER USING A JUNCTION GATE PHOTODIODE

(75) Inventors: Jaroslav Hynecek, Allen, TX (US); Hirofumi Komori, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 218 days.

This patent is subject to a terminal disclaimer.

(21) Appl. No.: 13/210,619

(22) Filed: Aug. 16, 2011

(65) Prior Publication Data

US 2012/0273654 A1    Nov. 1, 2012

Related U.S. Application Data

(60) Provisional application No. 61/479,118, filed on Apr. 26, 2011.

(51) Int. Cl.
*H01L 27/148* (2006.01)
*H01L 31/18* (2006.01)

(52) U.S. Cl.
USPC ............... 250/208.1; 250/214.1; 257/291; 257/E27.159; 257/E31.097; 438/76

(58) Field of Classification Search
USPC ........... 250/208.1, 214.1; 257/222, 291, 292, 257/E31.097, E27.159; 438/76
See application file for complete search history.

(56) References Cited

U.S. PATENT DOCUMENTS 5,070,380 A * 12/1991 Erhardt et al. ................ 257/222
2012/0273654 A1* 11/2012 Hynecek et al. ........... 250/208.1

OTHER PUBLICATIONS

Yasutomi Keita, "A 2.7e Temporal Noise 99.7% Shutter Efficiency 92dB Dynamic Range CMOS Image Sensor with Dual Global Shutter Pixels", IEEE International Solid-State Circuits Conference, (Feb. 10, 2010), 3 pgs.

* cited by examiner

*Primary Examiner* — Kevin Pyo

(57) ABSTRACT

The present invention provides a junction gate photo-diode (JGP) pixel that includes a JGP accumulating charge in response to impinging photons. The JGP is positioned on a substrate and includes a top n layer, a middle p layer and a bottom n layer forming a n-p-n junction, and a control terminal coupled to the top n layer. Also includes is a floating diffusion (FD) positioned on the substrate and coupled to a pixel output line through an amplifier. Also includes is a pinned barrier (PB) and a storage gate (SG) positioned on the substrate between the JGP and the FD. The PB temporarily blocks charge transfer between the JGP and the FD, and the SG stores the accumulated charge from the JGP, and transfers the stored charge to the FD for readout.

20 Claims, 6 Drawing Sheets

IMAGE SENSOR ARRAY FOR BACK SIDE ILLUMINATION WITH GLOBAL SHUTTER USING A JUNCTION GATE PHOTODIODE

CROSS REFERENCE TO RELATED APPLICATIONS

This application claims priority of U.S. Provisional Patent Application Ser. No. 61/479,118, filed Apr. 26, 2011, which is incorporated herein by reference. This application is also related to U.S. patent application Ser. No. 13/210,615, entitled "IMAGE SENSOR ARRAY FOR THE BACK SIDE ILLUMINATION WITH THE JUNCTION GATE PHOTO-DIODE PIXELS", filed on the same day.

FIELD OF THE INVENTION

The present invention relates, in general, to a back side illuminated (BSI) image sensor that implements pixels having junction gate photo-diodes (JGP), charge clearing gates (CG), storage gates (SG) and pinned barriers (PB). The well potentials of the JGPs and the SGs are controllable to store accumulated charge which is beneficial when the CMOS imager is operating in a global shutter mode. The PBs have a potential that temporarily blocks charge from transferring between the SGs and the floating diffusion (FD). Also, the CGs implement a vertical charge clearing mechanism which transfers accumulated electrons from the wells of the JGPs to the gates of the JGPs.

BACKGROUND OF THE INVENTION

In conventional CMOS sensors, the circuitry for several photo-diodes is shared. The pixels may include two photo-diodes located in neighboring rows that share the same circuitry.

Shown in FIG. 1 is a four transistor (4 T) pixel of the conventional CMOS sensor that has global shutter capabilities (i.e. all pixels perform charge integration simultaneously). After charge integration is completed in pinned photodiode 101, the accumulated charge is transferred (via transfer gate transistor 103) into second pinned photodiode 102 where it is stored for readout.

In this conventional system the second pinned photodiode has a higher pinning voltage, or transfer gate 103 has a potential barrier and a well incorporated in it to ensure proper charge transfer. Also, pinned diode 102 is shielded from the impinging photons 115 to prevent undesirable smear effects when the objects in the scene moves. The signal charge readout from second pinned diode 102 then proceeds by first resetting Floating Diffusion (FD) node 104 to the drain bias voltage by momentarily turning on reset transistor 106 followed by pulsing charge transfer transistor gate 105. This sequence then proceeds in a sequential order row by row.

The signal appearing on the FD is buffered by the source follower transistor 107 that is addressed by a row addressing transistor 108. The signals controlling the charge transfer transistor gates, the reset transistor, and the addressing transistor are supplied by the row bus lines 111, 112, 113 and 114 respectively. The Vdd bias is supplied to the pixels by the column Vdd line 109 and the signal output appears on the column output line 110.

Using the pinned diodes for charge storage is advantageous since it is well known that these diodes have a low dark current generation. High dark current in the storage sites would add to noise and would also generate undesirable shading effects in the image.

Unfortunately, the second pinned diode consumes a significant pixel area, thus increasing the size of the sensor and ultimately its cost. Another disadvantage of the pinned PD storage gate approach, is the higher, pinning voltage that is necessary for the storage diode. This utilizes a voltage swing that is determined by the maximum device operating voltage and therefore results in a restriction of charge storage capacity (reduced dynamic range (DR)).

DETAILED DESCRIPTION OF THE INVENTION

In general, the present invention provides a JGP pixel design with a storage gate, the vertical blooming control, and a vertical charge transfer MOS transistor used for clearing charge from the JGP, which can be used in back side illuminated image sensor arrays. The vertical JGP charge clearing to the gate and the vertical anti-blooming allow a reduction in pixel size thereby providing image sensor arrays with high pixel density while preserving high well capacity, low dark current, high Dynamic Range, and low noise.

Figure 1:
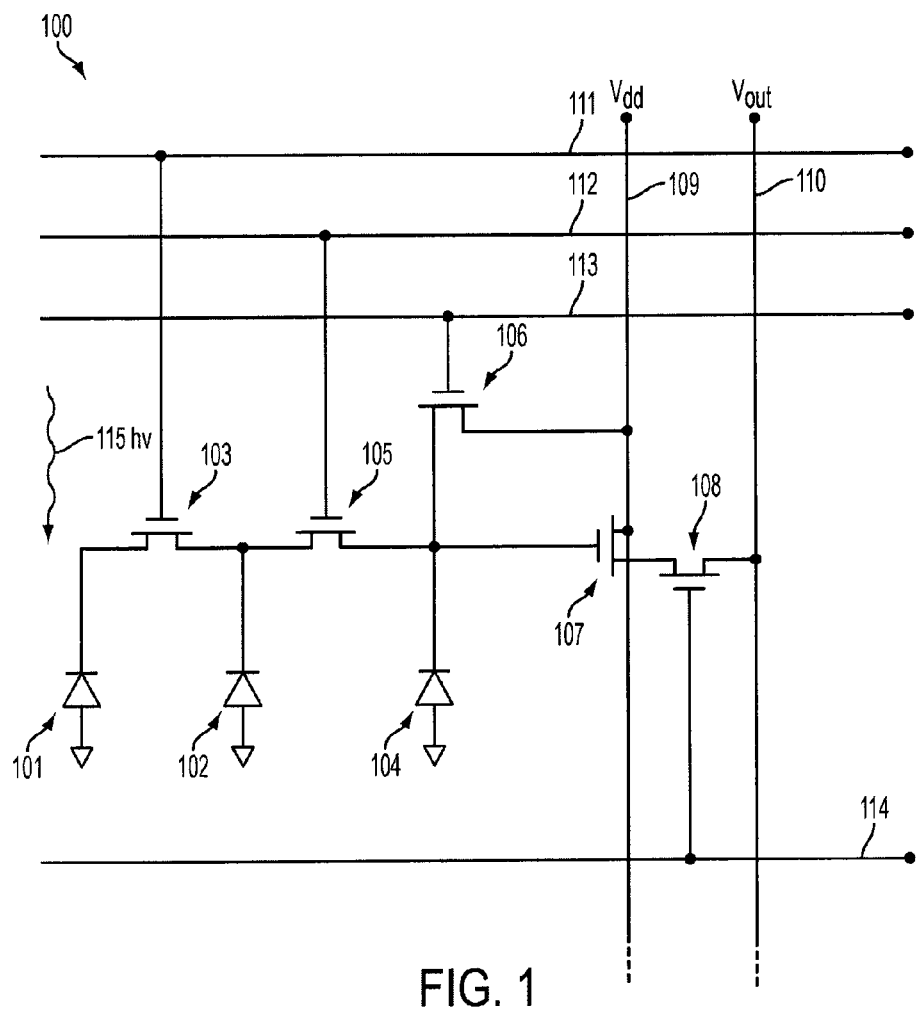
FIG. 1 is view of a row-shared pixel circuit schematic diagram with two pinned photo-diodes per circuit that is operating on the 4 T principle, according to an embodiment of the present invention.
Figure 2:
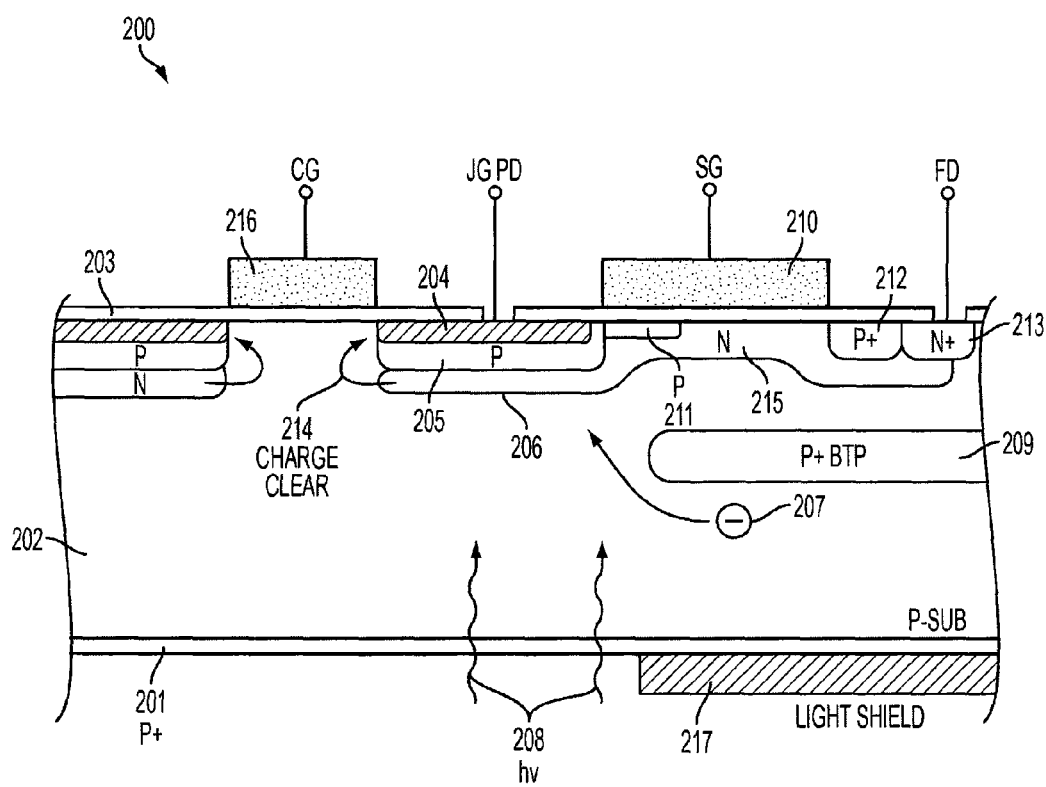
FIG. 2 is a cross-sectional view of the back side illuminated pixel with the junction gate photodiode, according to an embodiment of the present invention.

Shown in FIG. 2 is a cross-sectional view of the JGP pixel. The pixel is fabricated on a p+ type doped substrate 201, using a silicon epitaxial layer region 202 deposited on it. The bottom surface of the array is exposed to the image illumination and may have color filters arrays (CFAs) (e.g. Bayer filter), micro-lenses, and various light shielding layers 217 deposited on it. The top surface of the structure is covered by a dielectric layer 203 that provides electrical isolation of the substrate from the charge storage gate (SG) 210 and the charge clearing gate (CG) 216.

When photons 208 enter the substrate they create electrons 207, which then drift, under the influence of the electric field generated by the JGP pixel doping and bias, into the wells located in regions 206 where they are temporarily stored. The electrons that are generated in the un-depleted regions diffuse first into the depletion region boundaries from where they are again swept into the wells under the JGP. The JGP consists of a n+ type doped region 204 located close to the silicon-silicon dioxide interface, the p-type doped barrier 205, and the n-type doped charge storage region 206. The n+ type doped region is connected through a contact hole to a metal interconnect via that provides the bias to this region. In general, the bias can be changed to facilitate the charge transfer.

When the charge collection is completed, the bias on the JGP is lowered and on the SG 210 it is increased. This cause electrons from the JGP region 206 to flow over the potential barrier under the SG to the potential well. The SG barrier is formed by the implant 211 and the SG charge storage well may be formed by the n-type doping 215.

The JGP can be also reset by applying high bias to the charge clearing gate (CG) 216. This causes electrons stored in the region 206 to flow via the path 214 directly to the n+ doped JGP region 204 around the barrier formed by the doped region 205 and out to the gate driver that biases the JGP. The doping of the charge barrier 205 is selected such that the overflow charge from the JGP storage well can flow over it rather than to spread to neighboring pixel or to overflow to the charge storage well under the SG gate.

Charge readout from the SG well is accomplished by lowering the bias on this gate, which forces charge to flow over the pinned barrier formed by the p+ type doped region 212 and the n-type doped region 215 into the floating diffusion (FD) node 213. The SG region is shielded from the impinging photons by a light shield 217 and from the stray electrons by a BTP p+ doped barrier 209.

Figure 3:
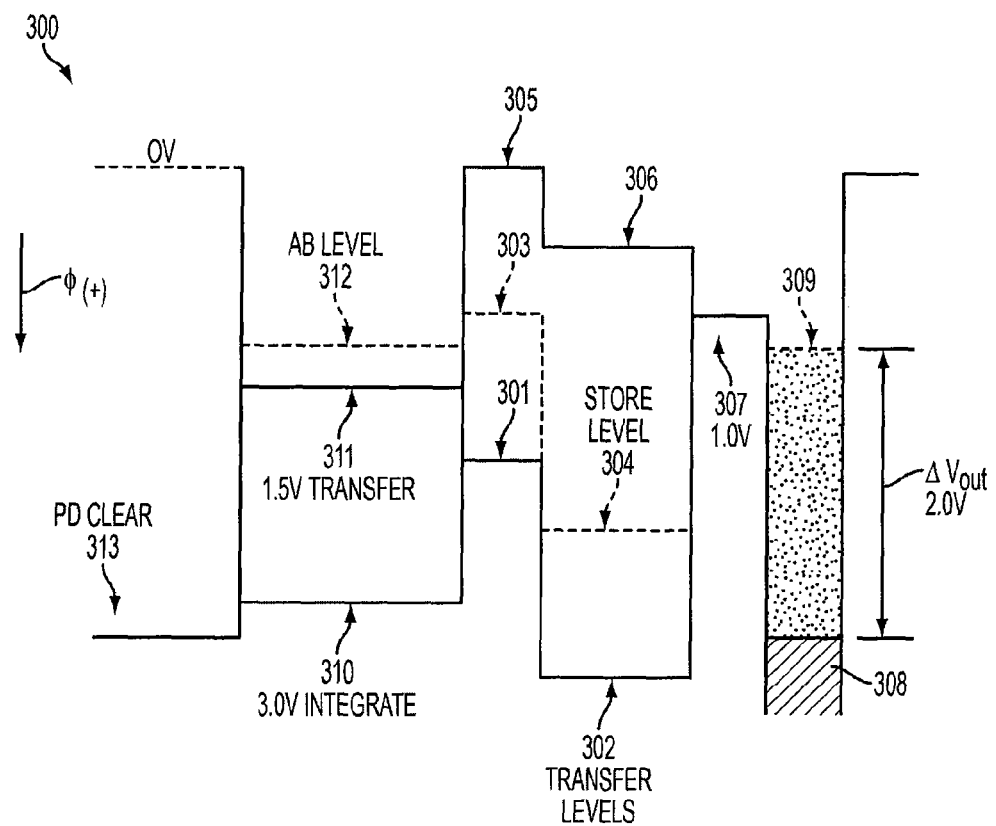
FIG. 3 shows the potential profiles of the pixel corresponding to the cross-section shown in FIG. 2 at various gate biasing conditions, according to an embodiment of the present invention.

Shown in FIG. 3 is the potential diagram in the JGP pixel in different pixel regions and for different biasing conditions. The storage gate is biased to three different levels resulting in three different potential wells. Level 301 and level 302 corresponds to the SG barrier and SG well potentials when the SG is biased high thus having the capability to receive charge from the JGP. During this time the JGP is biased low resulting in the level 311 in the JGP charge storage well. During the integration period the JGP is biased high, which cusses the JGP charge well to be at the potential level 310. When the CG gate is biased high, this results in the level 313 and charge is cleared from the JGP.

During the integration interval, the SG is biased at a mid level with the potentials under the SG barrier and SG well at levels 303 and 304 respectively. When charge is read out from the SG, the gate is pulsed low, resulting in potential levels 305 and 306 respectively. In general, this causes charge to flow over the pinned (fixed) barrier 307 into the FD charge detection node. The potential of the FD node then changes from its reset level 308 to its signal level 309 depending on the amount of the transferred charge.

The anti-blooming barrier at the level 312 is positioned such that charge can flow over it to the n+ doped JGP region and not over the barrier 303 into the SG well. The FD charge detection node is connected to the source follower SF transistor gate which buffers the signal that is then delivered to the analog to digital converters located at the periphery of the array.

In general, when the potential of the wells are increased, the wells are lowered (i.e. deep wells), whereas when the potential of the wells are decreased, the wells are raised (i.e. shallow wells). Thus, the potential of the JGP well may be lowered and then raised to accumulate and then transfer charge to the SG. The potential of the SG barrier/well may be lowered to receive the transferred charge from the JGP, raised to temporarily store the charge, and then raised higher to transfer the charge over the barrier and into the FD.

Figure 4:
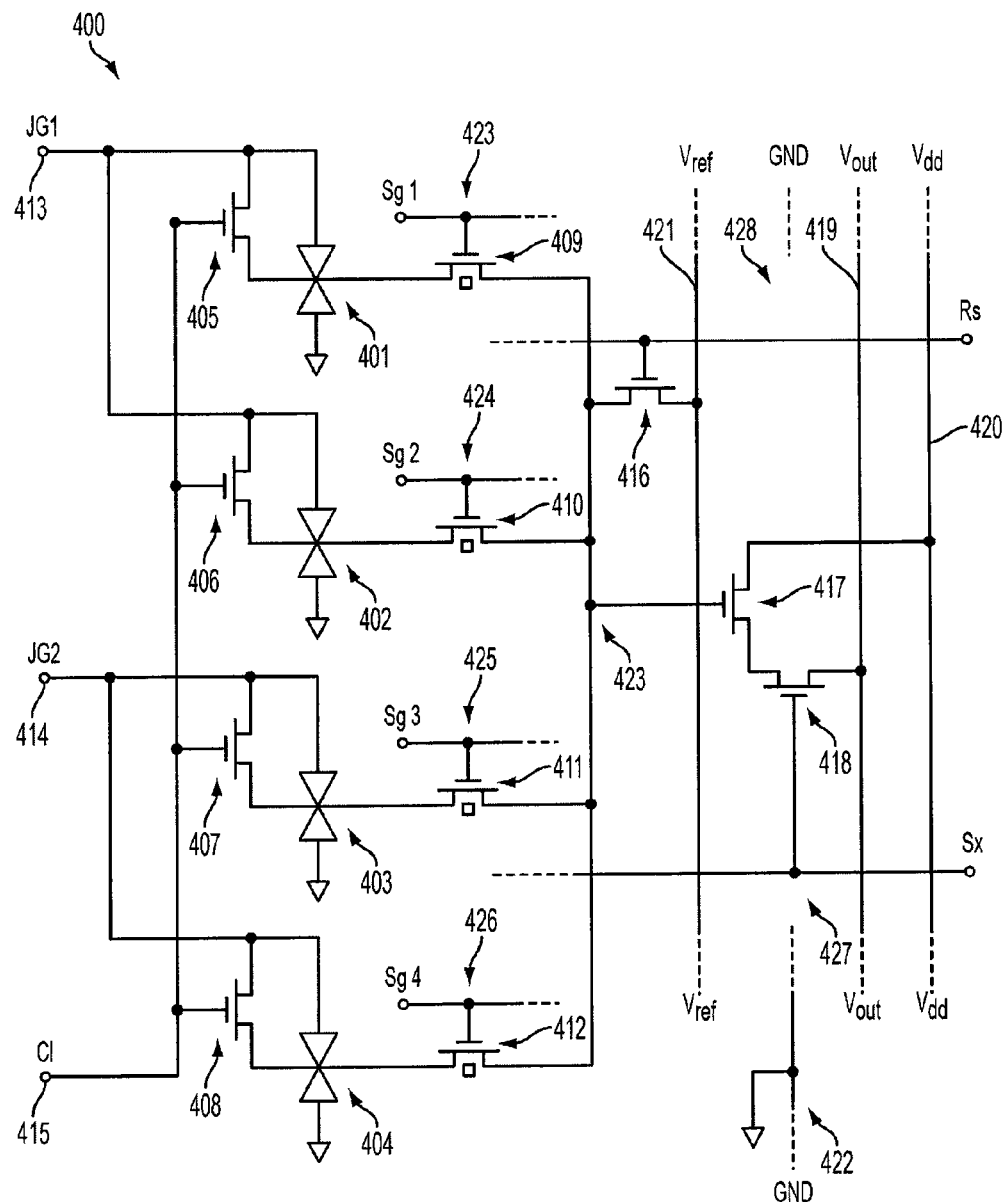
FIG. 4 is a view of a junction gate photodiode pixel circuit schematic diagram, according to an embodiment of the present invention.

Shown in FIG. 4. are pixels that are connected in a 4-PD shared configuration. The JGPs are the structures 401, 402, 403, and 404 respectively. The junction gates of JGPs 401 and 402 are connected together to a single bus line 413. Similarly, JGPs 403 and 404 are connected to a bus 414. The charge clearing transistors are 405, 506, 407, and 408 respectively. Their gates are connected to a single charge clearing bus 415. The charge storage gates are indicated as transistors 409, 410, 411, and 412 respectively, and are connected to a single FD charge detection node 423. This node is also connected to the gate of the Source Follower (SF) transistor 417.

The reset of the FD is accomplished through reset transistor 416 that resets the FD to a reference voltage supplied by column bus line 421. The SF drain is connected to the column power bus line 420 supplying drain voltage Vdd to the transistor. The row select transistor 418 then connects the output of the SF to the column signal output line 419. The row bus line 427 controls the row select transistor and the row bus line 428 controls the gate of the reset transistor 416. The remaining row bus lines 423, 424, 425, and 428 supply the signal to the respective storage gates.

The pixel can also have a ground column bus line 422. Other connection alternatives are also possible. The particular circuit configuration is described here as an example of one possible embodiment. The possible layout implementation of the circuit in FIG. 4 is shown in FIG. 5 where the metal interconnects are omitted for clarity.

Figure 5:
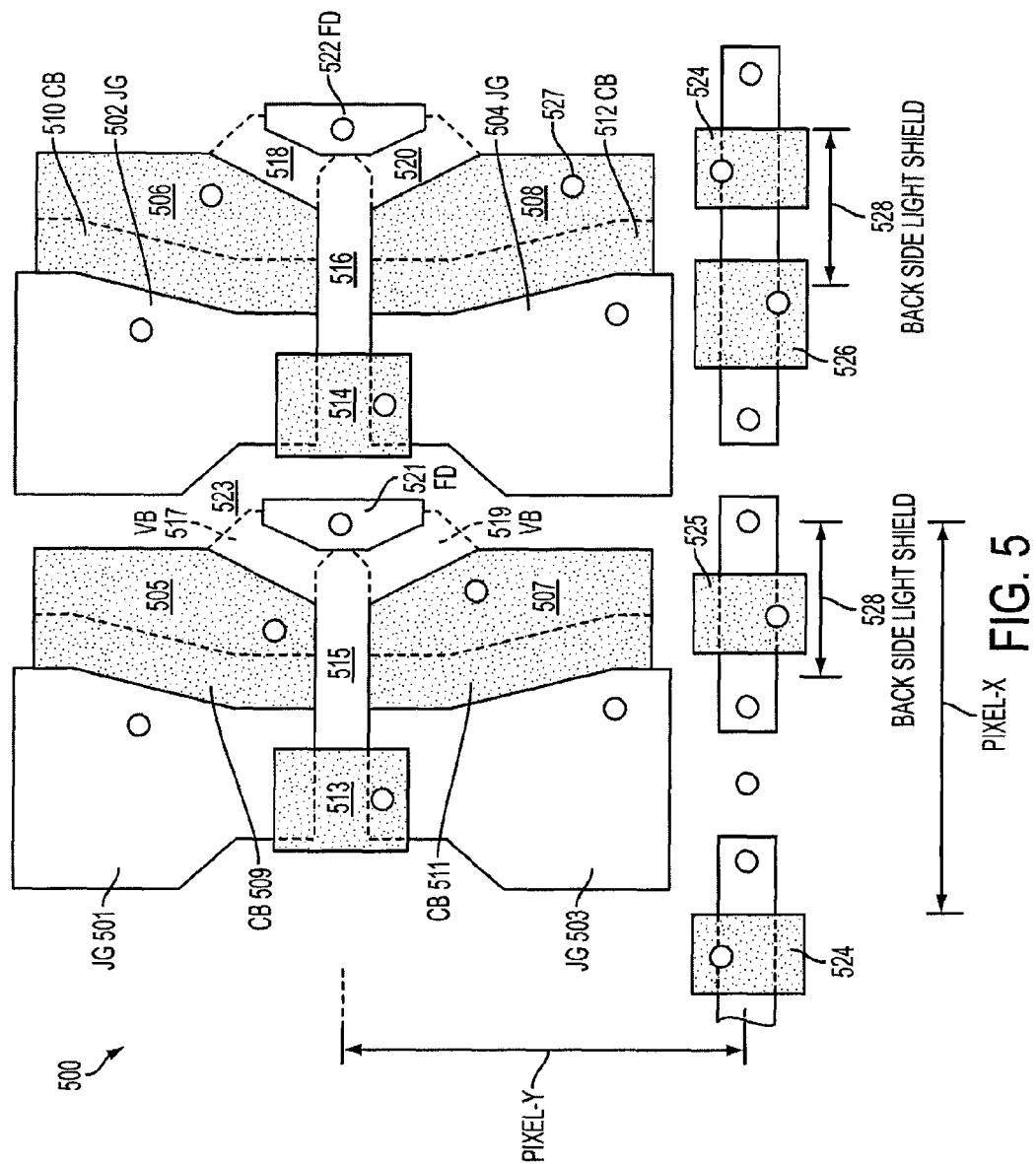
FIG. 5 is a view of the topology of one possible layout implementation of the 4-shared photodiode pixel structure, according to an embodiment of the present invention.

Shown in FIG. 5 is the top view of the pixel topology that describes the 4-shared JGP pixel configuration where metal vias 527 are shown as black dots. The regions 501, 502, 503, and 504 are the JGP regions. The regions 505, 506, 507, and 508 are storage gates with charge transfer barriers 509, 510, 511, and 512 respectively interfacing with the JGPs. The pinned transfer barriers are regions 517, 518, 519, and 520 that interface with floating diffusion regions 512 and 522. The pixel isolation regions are regions 523 and the charge clearing CG transistors are structures 513 and 514 respectively. Also, the shared circuit components are reset transistor structure 525, the SF transistor structure 526 and the addressing transistor structure 524.

The layout has a mirror symmetry in the y-pixel direction, that is compensated for by placing suitable electron barriers in the silicon bulk (not shown). Furthermore, the light shielding placed on the back-side of the sensor is placed in locations indicated by lines 528.

Figure 6:
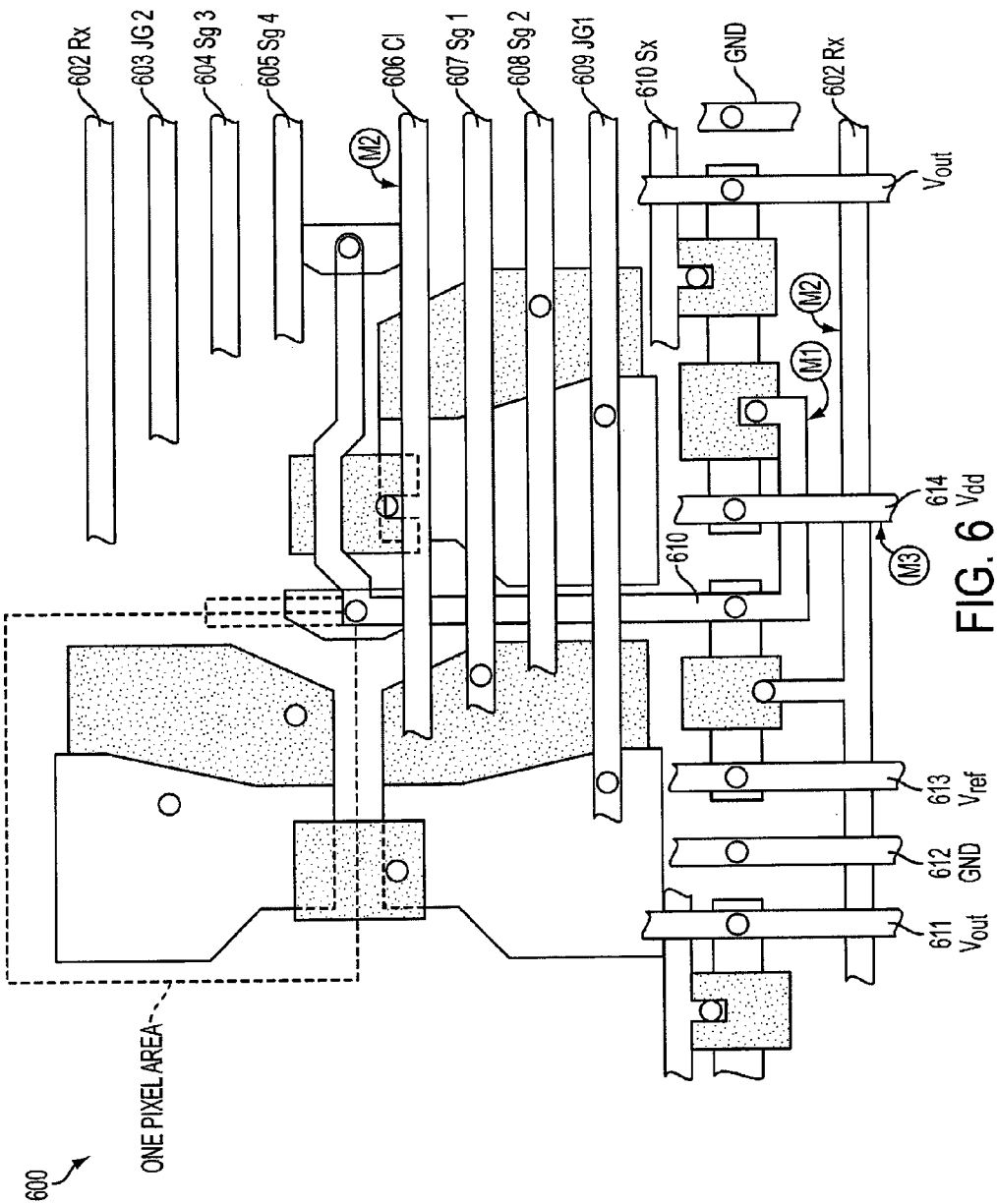
FIG. 6 is a view of the topology of one possible layout implementation of the 4-shared photodiode pixel structure that includes metal wiring, according to an embodiment of the present invention.

The wiring of the 4-shared JGP pixel layout from FIG. 5, is shown in FIG. 6. Metal line 601 is formed by a first metal layer M1 and connects the floating diffusions 521 and 522 with the reset transistor 525 and with the gate of the source follower 526. The reset gate row bus line 602 supplies the gate signal for the reset transistors, the line 603 for the junction gates 501 and 502, the lines 604, and 605 for the storage gates 507 and 508. The clearing gate bus line is line 606. Similarly lines 607 and 608 supply the signal to storage gates 503 and 504 respectively. Also, line 609 supplies the signal to JG 503 and 504.

The gates of the row select transistors are controlled by the signal supplied over line 610. All the horizontal row lines are formed using the metal layer M2. The column metal lines are formed by the third metal layer M3 and are as follows: line 611 is for the pixel output, line 612 is supplying the pixel ground bias, line 613 is supplying the pixel reference voltage, and line 614 is supplying the pixel drain bias.

It is of course possible to use other wiring alternatives, the one shown in this embodiment is used as an example to illustrate the wiring complexity of the BSI image sensor with pixels that have global shutter capability.

It is noted that in the global shutter mode, in general, all of the JGPs are simultaneously accumulating charge during an integration period. The charge is then transferred and stored under the SG during a storage period. The individual SGs may then pump the stored charge over the pinned barrier into the FD during a row by row readout period.

It is also noted that various control voltages for controlling the CG, JGP, SG, and the imager in general, (e.g. reset control voltage, integration control voltage, storage control voltage, transfer control voltage, readout control voltage, etc.) may be generated and applied by a controller (e.g. Micro-processor) that is not shown in the figures.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A junction gate photo-diode (JGP) pixel, comprising:
   a JGP accumulating charge in response to impinging photons, the JGP positioned on a substrate including a top n layer, a middle p layer and a bottom n layer forming a n-p-n junction, and a control terminal coupled to the top n layer;
   a floating diffusion (FD) positioned on the substrate and coupled to a pixel output line through an amplifier;
   a pinned barrier (PB) and a storage gate (SG) positioned on the substrate between the JGP and the FD,
   wherein the PB temporarily blocks charge transfer between the JGP and the FD, and the SG stores the accumulated charge from the JGP, and transfers the stored charge to the FD for readout.

2. The JGP pixel of claim 1, including
   a clearing gate (CG) positioned on the substrate adjacent to the JGP, the CG clearing charge accumulated in the JGP.

3. The JGP pixel of claim 1,
   wherein the PB is a p-doped region on the substrate that temporarily blocks the flow of electrons.

4. The JGP pixel of claim 3, including
   a plurality of other JGPs positioned on the substrate,
   a plurality of other SGs positioned on the substrate adjacent to the respective JGPs, and
   a plurality of other PBs positioned on the substrate adjacent to the respective SGs,
   the JGPs independently coupled to the FD through the respective SGs.

5. The JGP pixel of claim 4,
   a plurality of clearing gates (CGs) positioned on the substrate adjacent to the JGPs, the CGs clearing charge accumulated on the JGPs.

6. The JGP pixel of claim 3,
   wherein the FD is coupled to a reset line by a metal oxide semi-conductor (MOS) transfer gate, the MOS transfer gate clearing charge accumulated on the FD.

7. The JGP pixel of claim 1,
   wherein a plurality of JGP pixels are positioned on the substrate in an array as a complementary metal oxide semi-conductor (CMOS) imager.

8. A method for controlling a junction gate photo-diode (JGP) pixel, the pixel comprising a JGP, the JGP positioned on a substrate including a top n layer, a middle p layer and a bottom n layer forming a n-p-n junction, and a control terminal coupled to the top n layer, a floating diffusion (FD) positioned on the substrate and coupled to a pixel output line through an amplifier, a pinned barrier (PB) and a storage gate (SG) positioned on the substrate between the JGP and the FD, a clearing gate (CG) positioned on the substrate adjacent to the JGP, a reset gate positioned on the substrate and coupled to the FD, and a controller, the method comprising:
   applying, by the controller, during a reset period, a reset control voltage to the reset gate to clear charge accumulated in the FD, and a clearing control voltage to the CG to clear charge accumulated in the JGP,
   applying, by the controller, during an integration period, an integration control voltage to the JGP to accumulate charge in the JGP, a transfer control voltage to the JGP and another transfer control voltage to the SG to transfer the accumulated charge from the JGP to the SG, and a storage control voltage to the SG to store the transferred charge in the SG, and
   applying, by the controller, during a readout period, a readout control voltage to the SG to transfer the charge stored in the SG over the PB and into the FD for pixel readout.

9. The JGP pixel of claim 8,
   controlling, by the controller, the reset gate to couple the FD to a reset potential during the reset period, and
   controlling, by the controller, the CG to transfer electrons from a charge well of the JGP to the n layer of the JGP.

10. The JGP pixel of claim 8,
    controlling, by the controller, the integration control voltage to increase potential of a well of the JGP to accumulate charge in the JGP, and
    controlling, by the controller, the readout control voltage to decrease a potential of a well of the SG to block charge from flowing into the SG during integration.

11. The JGP pixel of claim 8,
    controlling, by the controller, the transfer control voltage to decrease a potential of a well of the JGP to transfer charge into the SG,
    controlling, by the controller, the other transfer control voltage to increase a potential of a well of the SG to receive charge from the JGP,
    controlling, by the controller, the storage control voltage to decrease the potential of the well of the SG to store the received charge, and
    controlling, by the controller, the readout control voltage to decrease the potential of the well of the SG to transfer charge over the PB and into the FD.

12. The JGP pixel of claim 8, including a plurality of other JGPs positioned on the substrate, a plurality of other SGs positioned on the substrate adjacent to the respective JGPs, a plurality of other PBs positioned on the substrate adjacent to the respective SGs, at least one other CG positioned on the substrate, the CG positioned adjacent to at least one of the JGPs and the at least one other CG positioned adjacent to at least another one of the JGPs, the method comprising:
    controlling, by the controller, the reset gate to couple the FD to a reset potential during the reset period, and
    controlling, by the controller, the CGs to transfer electrons from charge wells of the JGPs to the n layers of the JGPs.

13. The JGP pixel of claim 8, including a plurality of other JGPs positioned on the substrate, a plurality of other SGs positioned on the substrate adjacent to the respective JGPs, a plurality of other PBs positioned on the substrate adjacent to the respective SGs, at least one other CG positioned on the substrate, the CG positioned adjacent to at least one of the JGPs and the at least one other CG positioned adjacent to at least another one of the JGPs, the method comprising:
    controlling, by the controller, the integration control voltage to increase potentials of wells of the JGPs to accumulate charge in the JGPs, and
    controlling, by the controller, the readout control voltage to decrease potentials of wells of the SGs to block charge from flowing into the SGs during integration.

14. The JGP pixel of claim 8, including a plurality of other JGPs positioned on the substrate, a plurality of other SGs positioned on the substrate adjacent to the respective JGPs, a plurality of other PBs positioned on the substrate adjacent to the respective SGs, at least one other CG positioned on the substrate, the CG positioned adjacent to at least one of the JGPs and the at least one other CG positioned adjacent to at least another one of the JGPs, the method comprising:
- controlling, by the controller, the transfer control voltage to decrease potentials of wells of the JGPs to transfer accumulated charge into the SGs,
- controlling, by the controller, the other transfer control voltage to increase potentials of wells of the SGs to receive the accumulated charge from the JGPs,
- controlling, by the controller, the storage control voltage to decrease the potentials of the wells of the SGs to store the received charge in the SGs, and
- controlling, by the controller, the readout control voltage to decrease the potentials of the wells of the SGs to transfer charge over the PB and into the FD.

15. A method for forming a junction gate photo-diode (JGP) pixel on a substrate, the method comprising:
- forming a JGP on a substrate, the JGP including a top n layer, a middle p layer and a bottom n layer forming a n-p-n junction, and a control terminal coupled to the top n layer, the JGP accumulating charge in response to impinging photons;
- forming a floating diffusion (FD) on the substrate;
- forming a pinned barrier (PB) and a storage gate (SG) on the substrate between the JGP and the FD; and
- forming pixel wiring on the substrate above the JGP, FD, SG and PB, the pixel wiring coupled to the JGP, FD, SG and PB,
- wherein the PB temporarily blocks charge transfer between the JGP and the FD, the SG receives the accumulated charge from the JGP, stores the charge in the SG, and transfers the stored charge to the FD.

16. The JGP pixel of claim 15, including
- forming a plurality of other JGPs, a plurality of other SGs, a plurality of other PBs and at least one other CG on the substrate, and
- forming a plurality of isolation regions on the substrate,
- wherein at least one of the JGPs are separated from a first region of the FD by at least one of the SGs and at least one of the PBs, and
- wherein at least another one of the JGPs are separated from a second region of the FD by at least another one of the SGs and at least another one of the PBs, the JGPs are separated from each other by the isolation regions.

17. The JGP pixel of claim 16, including
- forming a first clearing gate (CG) on the substrate between two of the JGPs, and
- forming a second CG on the substrate between two other JGPs.

18. The JGP pixel of claim 15, including
- forming an p-doped barrier on the substrate below the SG, the p-doped barrier blocking electrons from transferring between the substrate and a charge well of the SG.

19. The JGP pixel of claim 18, including
- forming a light shield on the substrate below the p-doped barrier, the light shield blocking photons from impinging on the substrate.

20. The JGP pixel of claim 15,
- wherein the SG is formed to have a well region for storing charge, and a barrier region for blocking charge from transferring back into the JGP during storage and readout.

* * * * *